(12) United States Patent (10) Patent No.: US 12,601,768 B2

Struck-Süssmeier et al. (45) Date of Patent: Apr. 14, 2026

(54) MONITORING ASSEMBLY AND SYSTEM HAVING A MONITORING ASSEMBLY

(71) Applicant: TRUMA GERAETETECHNIK GMBH & CO. KG, Putzbrunn (DE)

(72) Inventors: Simon Struck-Süssmeier, Putzbrunn (DE); Herbert Kastenmeyer, Putzbrunn (DE); Sudarsan Vedantha, Putzbrunn (DE)

(73) Assignee: Truma Geraetetechnik GmbH & Co. KG, Putzbrunn (DE)

( * ) Notice: Subject to any disclaimer, the term of this patent is extended or adjusted under 35 U.S.C. 154(b) by 189 days.

(21) Appl. No.: 18/292,573

(22) PCT Filed: Jul. 21, 2022

(86) PCT No.: PCT/EP2022/070544

§ 371 (c)(1),
(2) Date: Jan. 26, 2024

(87) PCT Pub. No.: WO2023/006587

PCT Pub. Date: Feb. 2, 2023

(65) Prior Publication Data

US 2024/0345141 A1 Oct. 17, 2024

(30) Foreign Application Priority Data

Jul. 29, 2021 (DE) ..................... 10 2021 119 739.2

(51) Int. Cl.
H02H 3/247 (2006.01)
G01R 19/165 (2006.01)

(52) U.S. Cl.
CPC . G01R 19/16547 (2013.01); G01R 19/16523 (2013.01); H02H 3/247 (2013.01)

(58) Field of Classification Search
CPC .............. H02H 3/247; G01R 19/16547; G01R 19/16523
See application file for complete search history.

(56) References Cited

U.S. PATENT DOCUMENTS

| | | | |
|---|---|---|---|
| 10,004,123 B1 * | 6/2018 | Yang ...................... | H05B 47/24 |
| 2006/0120007 A1 * | 6/2006 | Legatti ................... | H01H 47/32 |
| | | | 361/160 |

(Continued)

FOREIGN PATENT DOCUMENTS

| | | |
|---|---|---|
| DE | 102010040031 B4 | 1/2019 |
| GB | 2023361 A | 12/1979 |

(Continued)

*Primary Examiner* — Harry R Behm

(74) *Attorney, Agent, or Firm* — McNees Wallace & Nurick

(57) ABSTRACT

The present disclosure relates to a monitoring assembly for monitoring a supply signal of an electrically operated component, wherein the monitoring assembly comprises a monitoring circuit and a control and evaluation unit assigned to the monitoring circuit. At least one galvanically isolated connection is provided between the monitoring circuit and the control and evaluation unit. The monitoring circuit includes at least one threshold-dependent component which generates a current signal as a function of an applied supply voltage. The supply voltage is an AC voltage. The at least one threshold-dependent component is configured so as to generate a current signal when the supply voltage is above a first threshold value. The control and evaluation unit is set up to evaluate the at least one transmitted output signal to determine a fault condition. The control and evaluation unit is set up to output a drive signal when the fault condition has been determined. A system is furthermore described.

18 Claims, 2 Drawing Sheets

(56)　　　　　　References Cited

U.S. PATENT DOCUMENTS

2013/0215163 A1* 　8/2013 　Umeda ............. G03G 15/2039
　　　　　　　　　　　　　　　　　　347/1
2019/0094312 A1* 　3/2019 　Kataoka ................. H02H 1/06

FOREIGN PATENT DOCUMENTS

| JP | S5062735 A | 5/1975 |
| JP | S583523 A | 1/1983 |
| JP | H0335170 A | 2/1991 |
| WO | 2012072075 A2 | 6/2012 |

* cited by examiner

MONITORING ASSEMBLY AND SYSTEM HAVING A MONITORING ASSEMBLY

FIELD OF DISCLOSURE

The present disclosure relates to a monitoring assembly for monitoring a supply signal of an electrically operated component. The present disclosure further relates to a system having an electrically operated component and a monitoring assembly.

BACKGROUND

Monitoring assemblies having a monitoring circuit which is also referred to as mains monitoring circuit are usually used in electronic systems to monitor a supply signal of at least one electrically operated component. The electrically operated component may be an electronic component, i.e. a component which requires the supply signal to be able to be operated.

Such monitoring assemblies are used, for example, in air-conditioners, in particular in air-conditioners in the field of vehicles or mobile homes. The monitoring assembly can then be used to monitor the supply of a component of the air-conditioner, for example a compressor of the air-conditioner, which may also be referred to as air-conditioner compressor.

The monitoring assemblies known from the prior art usually include complex circuits which require a large number of components, making the monitoring circuits complex and expensive to manufacture. In addition, the risk of failure of the overall monitoring assembly increases accordingly with each component used in the monitoring assembly. Simple approaches for the monitoring assemblies are also known from the prior art, which however provide only insufficiently precise or reliable monitoring results so that they cannot be used for high-quality applications.

From other technical fields, for example the field of electric or hybrid vehicles, it is known, among other things, to monitor a battery required for driving the electric or hybrid vehicle, i.e. the applied DC voltage of the battery. Such a monitoring is shown, among others, in document DE 10 2010 040 031 B4.

Document JP H03-35 170 A discloses a method in which only the duration of passages of the supply signal through a defined voltage range around zero is measured, i.e. the duration of the zero crossings, from which frequency information is to be derived.

In this respect, the object of the present disclosure is to permit a reliable and cost-effective detection of fault conditions in the supply signal of an electrically operated component, in particular dips in the supply signal of the electrically operated component.

SUMMARY

Example embodiments relate to a monitoring assembly for monitoring a supply signal of an electrically operated component. The monitoring assembly comprises a monitoring circuit and a control and evaluation unit assigned to the monitoring circuit. At least one galvanically isolated connection is provided between the monitoring circuit and the control and evaluation unit. The monitoring circuit includes at least one threshold-dependent component which is set up to generate a current signal as a function of an applied supply voltage of the supply signal. The supply voltage or the supply signal is an AC voltage. The monitoring circuit is set up to transmit at least one output signal to the control and evaluation unit which corresponds to the current signal generated by the at least one threshold-dependent component. The at least one threshold-dependent component is configured so as to generate a current signal when the supply voltage is above a first threshold value. The control and evaluation unit is set up to evaluate the at least one transmitted output signal to determine a fault condition. The control and evaluation unit is further set up to output a drive signal when the fault condition has been determined.

The monitoring assembly according to the present disclosure thus permits to detect dips in the supply signal in a reliable and cost-effective manner, as few components in the monitoring circuit are required therefor. The dips in the supply signal may be dips in the voltage, i.e. the voltage value, and/or dips in the frequency of the supply signal—in particular an AC voltage signal.

By means of the monitoring assembly, it is generally possible to prevent an unexpected failure of the electrically operated component or a blocking of a component of an air-conditioner such as the compressor, for example, as the fault condition is detected in time so that it is possible to react thereto. The unexpected failure of the electrically operated component usually results in a flow of high inrush or starting currents when the electric component is again put into operation, which in turn can cause the triggering of an existing fuse. Finally, a manual intervention by the operator is required to put the electrically operated component or a device comprising the component into operation again.

The monitoring assembly according to the present disclosure however ensures that the supply signal of the electrically operated component is continuously monitored such that the electrically operated component can be switched off in a controlled manner when a fault condition is detected. It is thus possible to avoid high currents during restarting or starting up, which would otherwise be necessary. In this respect, the continuous monitoring by means of the monitoring assembly according to the present disclosure makes it possible to switch off the electrically operated component in a controlled manner and to switch it on again in a correspondingly controlled manner, wherein a triggering of the fuse may be avoided. The switching off and on can take place automatically, i.e. without manual intervention.

The at least one galvanic isolated connection between the monitoring circuit and the control and evaluation unit can be realized by an optocoupler so that the control and evaluation unit is galvanically isolated from a supply voltage. The control and evaluation unit is thus accordingly protected from overvoltages or voltage peaks of the supply signal processed in the monitoring circuit. The galvanically isolated connection between the monitoring circuit and the control and evaluation unit thus constitutes a corresponding protective insulation which serves to disconnect public power supplies, for example.

The threshold-dependent component provided in the monitoring circuit may be configured as a Zener diode which allows a current flow depending on the voltage applied, i.e. generates a corresponding current signal. By means of the specific design of the corresponding threshold-dependent component, i.e. the Zener diode, it is possible to set the first threshold at which a fault condition is to be detected by the monitoring circuit, in particular the entire monitoring assembly.

For example, the fault condition is detected when the supply signal falls below the first threshold value because there is no longer any current flow or no current signal is generated.

The threshold-dependent component of the monitoring circuit therefore generates a current flow which depends on the voltage applied such that a current flow is present depending on the design of the threshold-dependent component, provided that the supply signal has a sufficiently high supply voltage. If the threshold-dependent component does not generate any current signal, this means that the voltage value of the supply signal is below the first threshold value or is not sufficient for the operation of the electrically operated component. If no current signal is generated, there is no corresponding output signal which is transmitted to the control and evaluation unit.

The control and evaluation unit detects this fault condition due to the missing output signal, as a result of which the control and evaluation unit can output the drive signal to switch off the electrically operated component in a purposeful and controlled manner or take it from the supply, i.e. disconnect it from the supply. A blocking of the electrically operated component or of a further component which cooperates with the electrically operated component can thus be effectively prevented.

In particular, the control and evaluation unit uses a reference signal to determine whether an output signal is present. In this respect, the control and evaluation unit may have at least one comparator at the inputs of which the reference signal and the output signal are present, provided that the output signal is present, i.e. in the event that the threshold-dependent component allows a current flow.

However, the threshold-dependent component of the monitoring circuit can also generate a current signal having a strength, a proportional output signal being then transmitted to the control and evaluation unit. The control and evaluation unit compares the received output signal with the reference signal to detect whether the output or current signal is greater or smaller than the reference signal. If the output or current signal is smaller than the reference signal, there is, for example, a fault condition, namely an (at least momentary) interruption of the supply signal or an undervoltage.

The monitoring of an AC voltage, as is the case here, differs fundamentally from the monitoring of a DC voltage, as is the case with a battery, a vehicle battery, for example.

One aspect provides that the monitoring circuit has two threshold-dependent components. In particular, the two threshold-dependent components are antiserially connected to each other. The two threshold-dependent components may each be configured as a Zener diode. Due to the antiserial arrangement of the two threshold-dependent components, the threshold-dependent components may be provided with corresponding polarity control for one respective half-wave of the supply signal designed as an AC voltage signal. In the antiserial arrangement of the two threshold-dependent components, in particular of the two Zener diodes, it is ensured that depending on the respective half-wave, i.e. a positive half-wave or a negative half-wave, one of the two threshold-dependent components is operated in a flow-through mode and the other of the two threshold-dependent components is operated in the specific operating range of the corresponding threshold-dependent component, a Zener voltage mode, for example.

Basically, a symmetrical trapezoidal output voltage of the antiserially arranged threshold-dependent components may result with a supply signal present as an AC voltage.

One further aspect provides that the monitoring circuit is set up to generate two current signals based on the supply signal, or to transmit two output signals to the control and evaluation unit, which correspond to the generated current signals. Due to the two output signals or the two current signals, it is possible that the control and evaluation unit can perform a frequency monitoring of the supply signal in addition to the level monitoring of the supply signal.

The two current signals are in particular assigned to half-waves of the supply signal present as an AC voltage. The positive half-wave is for example assigned to the first current signal or the first output signal, whereas the negative half-wave of the supply signal designed as an AC voltage is assigned to the second current signal or the second output signal. It is thus possible to process the two half-waves separately from each other, so that an independent level monitoring is possible for each of the half-waves. Furthermore, a common evaluation of the two half-waves of the supply signal present as an AC voltage is possible, to thus determine the mains frequency or the half-wave time ratio of the two half-waves, for example.

The control and evaluation unit may be set up to determine the duration of the output signals assigned to the two half-waves to determine the mains frequency and/or the half-wave time ratio of the supply signal. The respective duration of the two half-wave-dependent signals is sensed to thus obtain the mains frequency or the half-wave time ratio. The two output signals which are assigned to the half-waves are compared with a corresponding reference voltage in the control and evaluation unit. To this end, the control and evaluation unit includes a respective comparator, a first comparator being assigned to the first output signal, and a second comparator being assigned to the second output signal, in particular the input of the respective comparators.

Generally, the at least one comparator is assigned to a counter which counts at a constant frequency. As soon as the counter has reached a fixed value which is assigned to a defined period of time, it is thus possible to signalize the failure of the supply signal. To reset the counter, the output of the comparator is assigned to the counter. In this respect, the counter can always be reset when the comparator determines the presence of an output signal. A tolerance can be set by means of the counter, in particular the defined period of time, to thus tolerate short-term voltage dips in the supply signal.

It may furthermore be provided that the control and evaluation unit comprises two comparators, the two comparators being each assigned to a half-wave of the supply signal present as an AC voltage. In other words, the two comparators each process one half-wave of the two half-waves of the supply signal present as an AC voltage, i.e. the two current signals. In this respect, it is possible to evaluate each of the two half-waves separately from each other, in particular to compare them with the reference signal by means of the corresponding comparator.

Generally, the control and evaluation unit can be set up to determine at least the duration of a half-wave of the supply signal designed as an AC voltage, in particular by evaluating the at least one transmitted output signal. As explained above, the monitoring circuit outputs at least one output signal, in particular two output signals. The control and evaluation unit processes the at least one output signal such that the duration of the half-wave is determined. The at least one counter may be provided therefor, which determines the duration of the at least one half-wave-dependent signal, i.e. of the corresponding output signal.

In particular, the duration of the half-wave of the supply signal designed as an AC voltage comprises both the duration of a rising edge of the half-wave and the duration of a falling edge of the half-wave. It is thus provided that the rising section of the half-wave, i.e. the rising edge, and the falling section of the half-wave, i.e. the falling edge, of the respective half-wave are taken into account when the control and evaluation unit determines the duration of the corresponding half-wave. As already explained, the control and evaluation unit processes the output signal of the monitoring circuit assigned to the corresponding half-wave, i.e. the half-wave-dependent signal.

Basically, it is thus provided that the supply signal present as an AC voltage is converted into a current signal, for example by means of the monitoring circuit, in particular the at least one threshold-dependent component. The current signal thus obtained is then further processed, in particular by the monitoring circuit, so as to obtain the at least one output signal. Therefore, the at least one output signal has been obtained based on one of the two half-waves of the supply signal present as an AC voltage.

The monitoring circuit can output at least one output signal, in particular two output signals, which is/are transmitted to the control and evaluation unit.

The control and evaluation unit in turn determines the duration of the respective output signal or the half-wave of the supply signal present as an AC voltage on which the corresponding output signal is based.

To this end, the control and evaluation unit comprises at least one comparator which compares the received output signal with a reference signal to thus be able to determine the duration.

When evaluating the at least one output signal, both the duration of a rising edge of the underlying half-wave and the duration of a falling edge of the underlying half-wave are taken into account, in particular also a vertex section of the underlying half-wave which connects the rising edge and the falling edge. This applies analogously to both half-waves, provided that two output signals are present and are evaluated by the control and evaluation unit.

In this respect, it is possible to determine the duration of a rising section, of an adjoining vertex section, and of an adjoining falling section of the half-wave, namely in the case of a positive half-wave. Furthermore, it is possible to determine the duration of a falling section, of an adjoining vertex section, and of an adjoining rising section of the half-wave, namely in the case of a negative half-wave.

In this respect, both the period duration and the duration of the zero crossing are measured upon evaluation by means of the control and evaluation unit.

This results in a high degree of robustness with respect to short-term deviations and faults, even if the reaction time is slower than with methods based exclusively on the evaluation of the zero crossing.

According to a further aspect, two galvanically isolated connections are provided between the monitoring circuit and the control and evaluation unit assigned to the monitoring circuit. The two galvanically isolated connections can each be configured as an optocoupler, as a result of which it is ensured that the control and evaluation unit is galvanically isolated from the monitoring circuit.

In particular, the two galvanically isolated connections are configured so as to transmit the output signals assigned to the two half-waves separately from each other to the control and evaluation unit. It is thus possible that the output signals or current signals assigned to the half-waves of the supply signal can be evaluated separately from each other to thus determine the mains frequency or the half-wave time ratio.

A further aspect provides that the monitoring circuit includes a protective element and a fuse assigned to the protective element. The protective element may be a varistor, i.e. a voltage-dependent resistor. The protective element serves to protect the electrically operated component from overvoltages, the protective element being protected by the associated fuse.

According to one aspect, the control and evaluation unit has a supply interface for the power supply, wherein a sensor is assigned to the supply interface, which is set up to sense at least one characteristic of the power supply. The power supply of the control and evaluation unit may also be referred to as internal supply, wherein the control and evaluation unit is configured such that it still works even if the supply voltage is too low for the electrically operated component. The internal supply signal is measured accordingly via the sensor. The power supply or the internal supply is performed, for example, via an AC/DC converter assigned to the supply interface of the control and evaluation unit, via which the control and evaluation unit is accordingly supplied with energy. The sensor is in turn assigned to this supply interface to monitor the power supply.

The AC/DC converter is for example connected to the control and evaluation unit via a voltage divider. It is in particular possible to determine whether the output voltage of the AC/DC converter is below a determined threshold value.

The control and evaluation unit is in particular set up to detect a failure of the fuse, i.e. the fuse assigned to the protective element, based on the sensed characteristic of the power supply and the output of the monitoring circuit. To this end, the control and evaluation unit evaluates whether an internal mains signal from the voltage detection is missing, wherein the internal supply of the control and evaluation unit is provided via the supply interface, which is interpreted as an implicit indication of the failure of the fuse of the protective element. The power supply of the control and evaluation unit performed via a power supply unit or an AC/DC converter keeps the control and evaluation unit running even if signals are no longer received via the monitoring circuit. A second power supply unit is thus not required.

For example, the monitoring circuit does no longer supply any signal at less than 80 V from the supply, while the AC/DC converter assigned to the control and evaluation unit still functions up to 60 V and thus keeps the control and evaluation unit operational. Short-term total failures of the supply can be compensated for by an internal energy storage via capacitors.

In any case, it can thus be sensed whether the power supply is performed via the AC/DC converter and whether a signal from the monitoring circuit is (simultaneously) present. If, for example, power supply is possible via the AC/DC converter, which involves a voltage which would actually cause operation of the monitoring circuit, a failure of the fuse may be detected if nevertheless no signal is received from the monitoring circuit.

In this case, the control and evaluation unit can output a drive signal to transmit the corresponding failure condition. To this end, the control and evaluation unit can drive a user interface which signals to the user that the monitoring assembly or the device comprising the monitoring assembly requires maintenance. It can thus be ensured in a simple manner that a failure of the protective element, for example due to an overload, does not remain undetected, but is rectified accordingly.

A further aspect provides that the assembly includes a power supply unit having an AC/DC converter, wherein a sensor is assigned to the power supply unit, which senses a voltage value at the output of the power supply unit and transmits it to the control and evaluation unit. In particular, the voltage value is a low-voltage level. The signal sensed by the sensor can be used for an extended monitoring of the supply signal to thus obtain a detailed statement with regard to a fault condition of the supply signal.

In one configuration, the power supply unit with the AC/DC converter is used for the power supply of the control and evaluation unit and is, for example, connected to the aforementioned supply interface.

According to one aspect, the aforementioned sensor for the internal supply signal is configured as a voltage divider. Therefore, it is preferably provided as an aspect that the output of the power supply unit, preferably the output of the AC/DC converter, is connected to the control and evaluation unit via a voltage converter as a sensor. It is thus determined whether the supply voltage falls further below the lower threshold value.

In particular, the AC/DC converter is set up to output an output voltage up to a second threshold value for the supply signal, wherein the second threshold value is below the first threshold value. In other words, the AC/DC converter is configured such that the output voltage first only dips to a critical value below the undervoltage signalized by the monitoring circuit for the operation of the electrically operated component, resulting in the second voltage threshold value, which can also be used in the monitoring of the supply signal.

Generally, the control and evaluation unit can be set up to determine the duration of a failure of the at least one output signal, wherein the control and evaluation unit is set to compare the duration with a defined period of time to detect the failure condition when the duration of the failure is longer than the defined period of time. As explained above, this can be done in a simple manner via the counter which is assigned to the comparator and can be reset by the output signal thereof if a corresponding output signal of the monitoring circuit is applied at the input thereof. This corresponds to a basic monitoring by means of the monitoring assembly as due to the defined period of time, a period is defined from which the monitoring assembly only responds or which is still tolerated by the monitoring assembly. In other words, the control and evaluation unit does not output the drive signal if the determined duration of the failure of the at least one output signal, i.e. the reaction of the basic monitoring, is realized for a period which is shorter than the defined period of time, as the corresponding failure is still within the intended tolerance range. However, if the at least one output signal fails for a period which is longer than the defined period of time, the fault condition is detected, and the drive signal is output to purposefully switch off or shut down the electrically operated component or a component assigned to the electrically operated component or the superordinated device.

A further aspect provides that the control and evaluation unit is set up to detect the failure condition when a failure of the output voltage and a failure of the at least one output signal occur simultaneously, in particular irrespective of the duration of the failure of the at least one output signal. This constitutes an extended monitoring in which the corresponding fault condition is already determined and a drive signal is output when the failure of the output signal and the failure of the output voltage of the AC/DC converter occur simultaneously, in particular irrespective of the duration of the failure of the at least one output signal.

This means that the fault condition is detected even if the duration of the failure of the at least one output signal is still within the defined period of time. This is because the AC/DC converter has the second threshold value up to which the output voltage is output, wherein the second threshold value has a lower voltage level than the first threshold value, such that in case of a simultaneous failure of the output voltage and of the output signal, the voltage level of the supply signal is below the second threshold value, which indicates a very low supply voltage which results in a fault condition.

According to the present disclosure, the object is further achieved by a system which comprises an electrically operated component, for example a component of an air conditioner such as a compressor, and a monitoring assembly of the aforementioned type. The electrically operated component is connected to the monitoring assembly via a switching element. The switching element may be a relay, for example a semiconductor relay. It is thus ensured that the control and evaluation unit may be galvanically isolated from the monitoring circuit and from the electrically operated component, provided that the switching element is designed accordingly.

Generally, the switching element can be driven by the control and evaluation unit in the detected fault condition. This means that the drive signal to be output by the control and evaluation unit can be output to the switching element, which ensures a controlled switching off of the electrically operated component or of a component assigned to the electrically operated component.

In other words, the monitoring assembly is set up to drive the switching element as a function of a detected fault condition of the supply signal of the electrically operated component to interrupt the supply via the switching element in a controlled manner. It is thus ensured that an unnoticed switching off of the electrically operated component or of a component cooperating with the electrically operated component is avoided.

Alternatively, the drive signal can be used to directly switch off the electrically operated component or a component assigned to the electrically operated component in a controlled manner.

Due to the controlled and purposeful switching off, it is later generally possible to switch on or start up the corresponding component again in a controlled and purposeful manner, too high inrush currents being avoided.

Generally, the monitoring assembly makes it possible to make a statement about the mains voltage, i.e. the level of the mains voltage, and the mains frequency of the supply signal supplied to the electrically operated component.

Furthermore, the monitoring assembly can be used to determine the condition of the protective element, in particular the condition of the fuse assigned to the protective element.

In addition, it is possible to set the monitoring assembly in the field, i.e. without changing the hardware, by setting parameters used for monitoring, the defined period of time, for example.

Due to the simple structure, the monitoring assembly ensures that it reacts quickly to dips in the supply signal, for example voltage and/or frequency dips, a tolerance with respect to short-term or minor dips being simultaneously given.

BRIEF DESCRIPTION OF DRAWINGS

Further advantages and features of the present disclosure will become apparent from the description below and from the drawings to which reference is made and in which.

DETAILED DESCRIPTION

Figure 1:
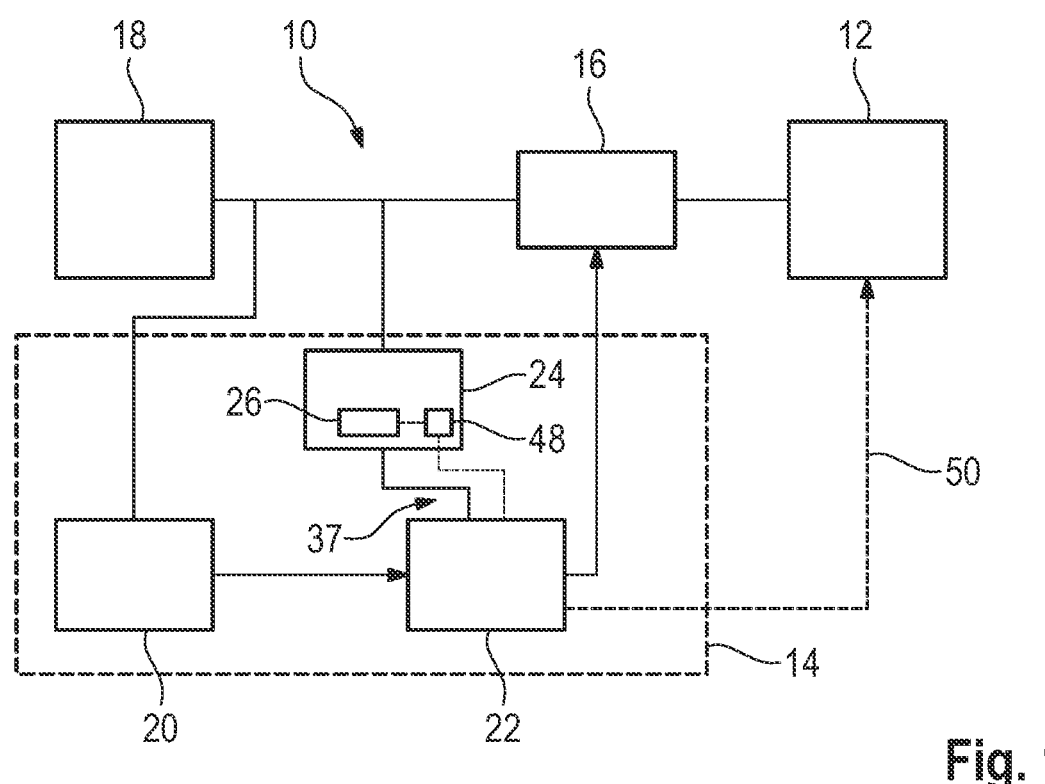
FIG. 1 shows a schematic representation of a system including a monitoring assembly according to an example embodiment.

FIG. 1 shows a system 10 which comprises an electrically operated component 12 and a monitoring assembly 14 which are connected to each other via a switching element 16.

The electrically operated component 12 is operated by a supply voltage or a supply signal of a supply 18, the monitoring assembly 14 monitoring the supply signal.

The electrically operated component 12 is connected to the supply 18 via the switching element 16, so that the electrically operated component 12 can be disconnected from the supply 18.

In particular, the switching element 16 is a relay, for example a semiconductor relay, so that the electrically operated component 12 can be galvanically isolated from the supply 18.

The monitoring assembly 14 comprises a monitoring circuit 20, a control and evaluation unit 22 assigned to the monitoring circuit 20, and a power supply unit 24 having an AC/DC converter 26, which will be discussed in detail below.

The monitoring assembly 14 is coupled to the supply 18 via a monitoring circuit 20, so that the monitoring circuit 20 senses and monitors the supply signal provided by the supply 18, in particular with regard to the voltage value and/or the frequency of the supply signal.

Figure 2:
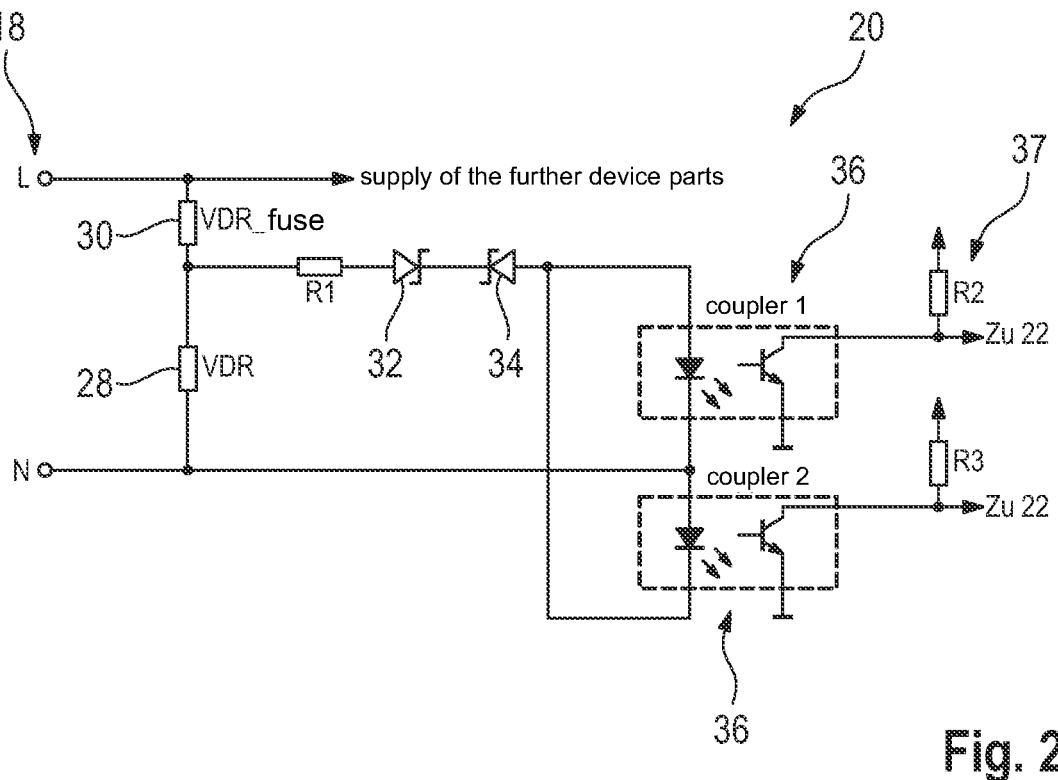
FIG. 2 shows a schematic representation of the monitoring assembly according to an example embodiment.

The monitoring circuit 20 is shown in more detail in FIG. 2, from which it is apparent that the monitoring circuit 20 includes a protective element 28 in the form of a varistor ("VDR") and a fuse 30 assigned to the protective element 28, which serve to keep an overvoltage away from the electrically operated assembly 12 to thus protect the electrically operated component 12 from the overvoltage.

Furthermore, the monitoring circuit 20 comprises two threshold-dependent components 32, 24 which are configured as Zener diodes. The two threshold-dependent components 32, 34 are arranged antiserially, which allows the supply signal to be rectified.

Generally, the threshold-dependent components 32, 34 provide at least one current signal which depends on the voltage value of the supply signal. This means that if a supply voltage is present which is above a first threshold value, a corresponding current signal is provided which can be transmitted by the monitoring circuit 20 to the control and evaluation unit 22, in particular in the form of an output signal.

The first threshold value can be predefined due to the appropriate design of the threshold-dependent components 32, 34.

At least one galvanically isolated connection 36 is provided between the control and evaluation unit 22 and the monitoring circuit 20 to galvanically isolate the control and evaluation unit 22 from the monitoring circuit 20, in particular from the supply voltage applied which is provided by the supply 18.

In the embodiment shown, the control and evaluation unit 22 is connected to the monitoring circuit 20 via two galvanically isolated connections 36 which are each configured as an optocoupler, as is apparent from FIG. 2.

There is a connection to the power supply unit 24 and in particular to the AC/DC converter 26 via the resistors R2 and R3. Both resistors R2, R3 thus form the supply interface of the control and evaluation unit 22. In this respect, the control and evaluation unit 22 has a supply interface 37 for the power supply.

Output signals which correspond to two current signals provided by the monitoring circuit 20 are forwarded to the control and evaluation unit 22 via the two optocouplers.

As can be seen from FIG. 2, the monitoring circuit 20 is configured such that current signals are produced which are assigned to the two half-waves of the supply signal present as an AC voltage signal and which are transmitted separately from each other to the control and evaluation unit 22, namely by means of the output signals transmitted by the optocouplers.

The control and evaluation unit 22 thus receives the two output signals from the monitoring circuit 20, the control and evaluation unit 22 evaluating the two output signals to detect a fault condition in the supply signal.

Figure 3A:
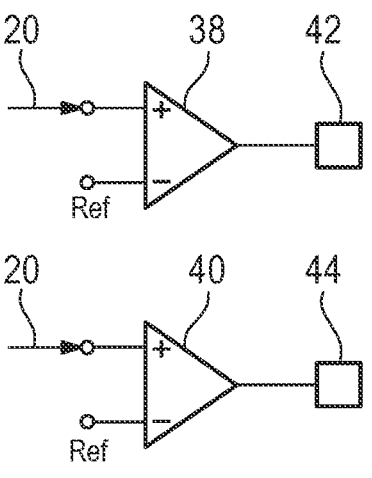
FIG. 3a shows a schematic representation of the control and evaluation unit used in the monitoring assembly according to a first example embodiment.

FIG. 3a exemplarily shows that the control and evaluation unit 22 compares each of the received output signals with a reference signal.

To this end, the control and evaluation unit 22 comprises a first comparator 38 and a second comparator 40 which receive the first output signal and the second output signal, respectively, if these are generated by the monitoring circuit 20.

The two comparators 38, 40 are thus set up to compare the voltage level of the respective half-wave of the supply signal with the reference signal. This enables a corresponding level monitoring for the respective half-waves.

The level monitoring can be carried out via the first threshold value set by the threshold-dependent components 32, 34. As described in the introductory part, a current signal is generated only if the voltage level of the supply voltage is above the first threshold value.

Accordingly, the output signal of the assigned half-wave of the supply signal or no output signal is applied to the respective input of the corresponding comparator 38, 40, the positive input, for example, if the voltage level is below the first threshold value.

If no output signal of the monitoring circuit is applied to the respective input of the comparator 38, 40, the comparator 38, 40 switches over accordingly due to the reference signal applied to the other input.

In the embodiment shown, the two comparators 38, 40, in particular the outputs thereof are additionally each assigned to a counter 42, 44, via which the duration of the half-wave-dependent signals, i.e. the respective output signals can be determined. The counters 42, 44 count at a defined frequency of the output signal of the respective comparator 38, 40 to thus determine the duration of the half-wave-dependent signals. In other words, the two counters 42, 44 are used, so that a separate analysis of both half-waves is possible.

It is thus possible that in addition to the level monitoring, the mains frequency or the half-wave time ratio is also monitored to detect a corresponding fault condition of the supply signal.

Figure 3B:
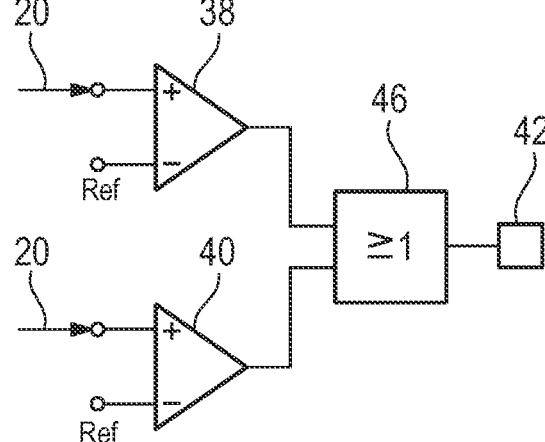
FIG. 3b shows a schematic representation of the control and evaluation unit used in the monitoring assembly according to a second example embodiment.

FIG. 3b shows an alternative embodiment of the control and evaluation unit 22, which compared to that of FIG. 3a, is more resource-efficient as only one counter 42 is provided.

The two comparators 38, 40 are connected on the output side to a corresponding OR link 46 which is therefore arranged between the counter 42 and the comparators 38, 40. It is thus possible to reset the counter 42 if, for example, an output signal of the monitoring circuit 20 is not applied to any of the inputs of the comparators 38, 40, as both outputs of the comparators 38, 40 are coupled to the counter 42 via the OR link 46.

Generally, the comparators 38, 40, the at least one counter 42, and, if provided, the OR link 46 are realized in a microcontroller which is configured accordingly.

It is generally provided that an interrupt signal is generated by the control and evaluation unit 22 when the power supply has failed. Prior thereto, everything takes place on the hardware side so that evaluation software is initially not used for evaluation with respect to the half-wave monitoring.

In principle, the control and evaluation unit 22, in particular the respective first inputs of the comparators 38, 40, are connected to the monitoring circuit 20, in particular outputs of the optocoupler, as can be seen from FIGS. 2 and 3.

In this respect, the first optocoupler can be connected on the output side to an input of the first comparator 38, the positive input, for example, and the second optocoupler can be connected on the output side to an input of the second comparator 40, the positive input, for example, so that the output signals are forwarded to the comparators 38, 40. The respective other inputs of the comparators 38, 40 receive the reference signal.

Furthermore, the control and evaluation unit 22 receives a signal from the power supply unit 24, in particular a sensor 48 assigned to the power supply unit 24, which senses an output voltage of the AC/DC converter 26. The voltage value is in particular an output voltage level of the power supply unit 24.

The power supply unit 24 generally serves to supply the control and evaluation unit 22 with electrical energy and can thus also be referred to as internal supply.

In other words, the sensor 48 is therefore also assigned to the supply interface 37 of the control and evaluation unit 22, the sensor 48 being set up to sense at least one characteristic of the power supply.

The AC/DC converter 24 is configured to output an output voltage up to a second threshold value for the supply signal, wherein the second threshold value is below the first threshold value which is assigned to the monitoring circuit 20, in particular the threshold-dependent components 32, 34.

In this respect, the AC/DC converter 24 still provides an output voltage which can be used, for example, to supply the control and evaluation unit 22, even if the monitoring circuit 20 would already have detected a fault condition.

In this respect, the control and evaluation unit 22 receives several pieces of information or sensor signals which can be used to detect the fault condition of the supply signal to thus detect it in a correspondingly reliable manner.

The control and evaluation unit 22 is in particular set up to determine the duration of the failure of the at least one output signal, which is compared with a defined period of time to detect the fault condition. In other words, the control and evaluation unit 22 determines how long no current signal has been transmitted by the monitoring circuit 20, the corresponding duration being compared with the defined period of time.

The defined period of time represents a tolerance range which tolerates short interruptions of the current signal as uncritical, so that unnecessary activations of the monitoring assembly 14 are avoided.

Only if the output signal of the monitoring circuit 20 is not transmitted for a period which is greater than the defined period of time, a corresponding fault condition is detected causing the control and evaluation 22 to output the drive signal.

Figure 4:
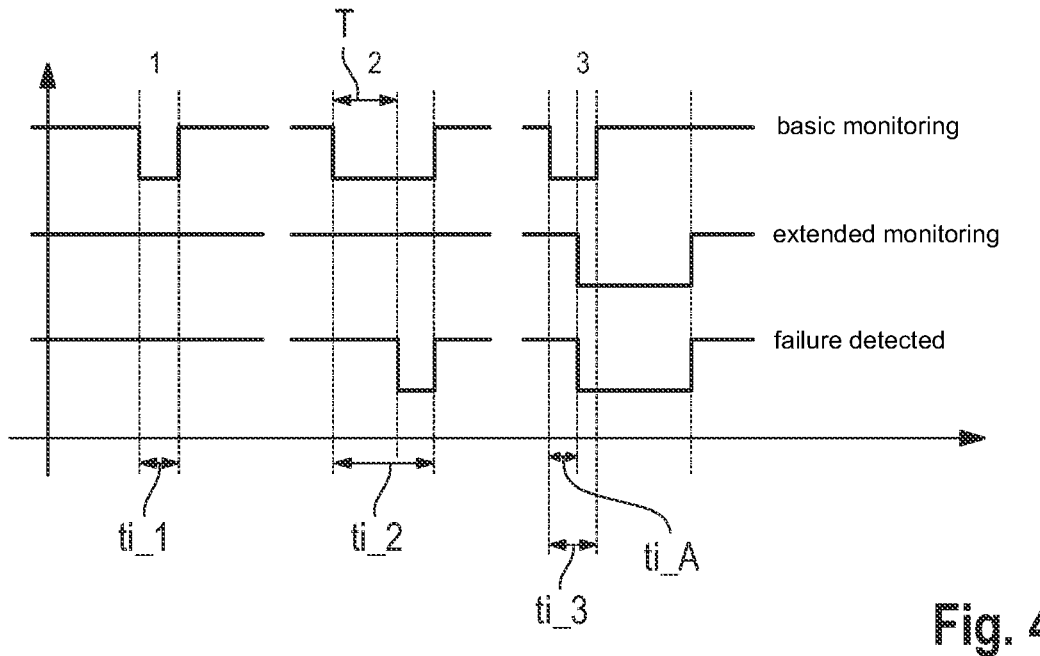
FIG. 4 shows an overview which illustrates the different scenarios in the monitoring by means of the monitoring assembly according to an example embodiment.

The two aforementioned scenarios are shown in FIG. 4 accordingly for "1" an "2", the defined period of time T being not exceed in the first case "1" by the duration "ti_1", but being exceeded in the second case "2" by the duration "ti_2", as a result of which the drive signal "failure detected" was output in the second case "2".

In addition, FIG. 4 shows a further scenario "3", in which a fault condition has already been detected, though the basic monitoring performed by the monitoring circuit 20 has first not transmitted the output signal for a duration which is less than the defined period of time T.

The fault condition has nevertheless been detected, as simultaneously it has already been detected that the output voltage of the AC/DC converter 24 is also interrupted, as a result of which it can be concluded that the voltage provided by the supply signal is also below the second threshold value implemented by the AC/DC converter 24.

In this respect, it is determined that the voltage level of the supply signal is below both threshold values, which is why the fault condition is present which should result in a defined and controlled switching off of the electrically operated component 12.

Therefore, the drive signal is already output after the time "ti_A", though this duration is significantly below the defined period of time T.

For example, the control and evaluation unit 22 controls the switch 16 accordingly to galvanically isolate the electrically operated component 12 from the supply 18.

Alternatively or additionally, it may also be provided that the control and evaluation unit 22 drives the electrically operated component 12 directly or a component cooperating with the electrically operated component 12 directly to switch it off or shut it down in a controlled manner. To this end, a drive line 50 may be provided which is represented in a dashed line in FIG. 1.

With the monitoring assembly 14 according to the present disclosure, it is basically possible to completely galvanically isolate the control and evaluation unit 22 from the supply 18, provided that the power supply unit 24 and the switching element 16 are configured accordingly. This is due to the fact that the galvanically isolated connection is provided between the monitoring circuit 20 and the control and evaluation unit 22.

In addition, the monitoring circuit 20 has a correspondingly simple design, as a result of which it is not susceptible to faults.

Furthermore, it is possible with the monitoring assembly 14 to make a statement with respect to the mains voltage, in particular the voltage value of the mains voltage, the mains frequency, and the state of the protective element 28 provided in the monitoring circuit 20 or the fuse thereof 30.

Furthermore, it is possible to implement a tolerance to short-term or minor changes in the supply signal so that unnecessary activations of the monitoring assembly 14 are avoided.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A monitoring assembly for monitoring a supply signal of an electrically operated component, comprising:

a monitoring circuit and a control and evaluation unit assigned to the monitoring circuit, wherein at least one galvanically isolated connection is provided between the monitoring circuit and the control and evaluation unit assigned to the monitoring circuit, wherein the monitoring circuit includes at least one threshold-dependent component which is set up to generate a current signal as a function of an applied supply voltage of the supply signal, and presented as an AC voltage, wherein the monitoring circuit is set up to transmit at least one output signal to the control and evaluation unit, which corresponds to the current signal generated by the at least one threshold-dependent component, wherein the at least one threshold-dependent component is configured so as to generate the current signal when the supply voltage is above a first threshold value, wherein the control and evaluation unit is set up to evaluate the at least one transmitted output signal to determine a fault condition, wherein the control and evaluation unit is set up to output a drive signal when the fault condition has been determined, wherein the control and evaluation unit has a supply interface to a power supply, wherein a sensor is assigned to the supply interface, which is set up to sense at least one characteristic of the power supply, and wherein the control and evaluation unit is set up to detect a failure of a fuse based on the sensed characteristic of the power supply and the output of the monitoring circuit.

2. The monitoring assembly according to claim 1, wherein the monitoring circuit has two threshold-dependent components.

3. The monitoring assembly according to claim 1, wherein the monitoring circuit is set up to generate two current signals based on the supply signal or to transmit two output signals to the control and evaluation unit which correspond to the generated current signals, wherein the two current signals are assigned to half-waves of the supply signal present as the AC voltage, wherein the control and evaluation unit is set up to determine a duration of the output signals assigned to the two half-waves to determine the mains frequency and/or the half-wave time ratio of the supply signal.

4. The monitoring assembly according to claim 1, wherein the control and evaluation unit comprises two comparators, wherein the two comparators are each assigned to a half-wave of the supply signal present as the AC voltage.

5. The monitoring assembly according to claim 1, wherein the control and evaluation unit is set up to determine at least a duration of a half-wave of the supply signal designed as the AC voltage, in particular by evaluating the at least one transmitted output signal.

6. The monitoring assembly according to claim 5, wherein the duration of the half-wave of the supply signal designed as the AC voltage comprises both a duration of a rising edge of the half-wave and a duration of a falling edge of the half-wave.

7. The monitoring assembly according to claim 1, wherein that two galvanically isolated connections are provided between the monitoring circuit and the control and evaluation unit assigned to the monitoring circuit.

8. The monitoring assembly according to claim 1, wherein the monitoring circuit has a protective element.

9. The monitoring assembly according to claim 8, wherein the protective element is designed as a varistor, and a fuse is assigned to the protective element.

10. The monitoring assembly according to claim 1, wherein the monitoring assembly has a power supply unit having an AC/DC converter, a sensor being assigned to the power supply unit, which senses a voltage value at the output of the power supply unit and transmits it to the control and evaluation unit, wherein the voltage value is a low-voltage level.

11. The monitoring assembly according to claim 10, wherein the AC/DC converter is set up to output an output voltage up to a second threshold value for the supply signal, wherein the second threshold value is below the first threshold value.

12. The monitoring assembly according to claim 1, wherein the control and evaluation unit is set up to determine a duration of a failure of the at least one output signal, wherein the control and evaluation unit is set up to compare the duration with a defined period of time to detect the fault condition if the duration of the failure is longer than the defined period of time.

13. The monitoring assembly according to claim 11, wherein the control and evaluation unit is set up to detect the fault condition if a failure of the output voltage and a failure of the at least one output signal occur simultaneously, irrespective of the duration of the failure of the at least one output signal.

14. A system comprising an electrically operated component and a monitoring assembly according to claim 1, wherein the electrically operated component is connected to the monitoring assembly via a switching element, wherein the monitoring assembly is set up to drive the switching element depending on a detected fault condition of the supply signal of the electrically operated component to interrupt the supply via the switching element in a controlled manner.

15. The monitoring assembly according to claim 1, wherein the monitoring circuit has two threshold-dependent components, wherein the two threshold-dependent components are antiserially connected to each other.

16. The monitoring assembly according to claim 1, wherein two galvanically isolated connections are provided between the monitoring circuit and the control and evaluation unit assigned to the monitoring circuit, wherein the two galvanically isolated connections transmit the output signals assigned to the two half-waves separately from each other to the control and evaluation unit.

17. A monitoring assembly for monitoring a supply signal of an electrically operated component, comprising:

a monitoring circuit and a control and evaluation unit assigned to the monitoring circuit, wherein at least one galvanically isolated connection is provided between the monitoring circuit and the control and evaluation unit assigned to the monitoring circuit, wherein the monitoring circuit includes at least one threshold-dependent component which is set up to generate a current signal as a function of an applied supply voltage of the supply signal, and presented as an AC voltage, wherein the monitoring circuit is set up to transmit at least one output signal to the control and evaluation unit, which corresponds to the current signal generated by the at least one threshold-dependent component, wherein the at least one threshold-dependent component is configured so as to generate the current signal when the supply voltage is above a first threshold value, wherein the control and evaluation unit is set up to evaluate the at least one transmitted output signal to determine a fault condition, wherein the control and evaluation unit is set up to output a drive signal when the fault condition has been determined, wherein the monitoring assembly has a power supply unit having an AC/DC converter, a sensor being assigned to the power supply unit, which senses a voltage value at the output of the power supply unit and transmits it to the control and evaluation unit, wherein the voltage value is a low-voltage level, wherein the AC/DC converter is set up to output an output voltage up to a second threshold value for the supply signal, wherein the second threshold value is below the first threshold value, and wherein the control and evaluation unit is set up to detect the fault condition if a failure of the output voltage and a failure of the at least one output signal occur simultaneously, irrespective of the duration of the failure of the at least one output signal.

18. A monitoring assembly for monitoring a supply signal of an electrically operated component, comprising:

a monitoring circuit and a control and evaluation unit assigned to the monitoring circuit, wherein at least one galvanically isolated connection is provided between the monitoring circuit and the control and evaluation unit assigned to the monitoring circuit, wherein the monitoring circuit includes at least one threshold-dependent component which is set up to generate a current signal as a function of an applied supply voltage of the supply signal, and presented as an AC voltage, wherein the monitoring circuit is set up to transmit at least one output signal to the control and evaluation unit, which corresponds to the current signal generated by the at least one threshold-dependent component, wherein the at least one threshold-dependent component is configured so as to generate the current signal when the supply voltage is above a first threshold value, wherein the control and evaluation unit is set up to evaluate the at least one transmitted output signal to determine a fault condition, wherein the control and evaluation unit is set up to output a drive signal when the fault condition has been determined, wherein the control and evaluation unit is set up to determine a duration of a failure of the at least one output signal, wherein the control and evaluation unit is set up to compare the duration with a defined period of time to detect the fault condition if the duration of the failure is longer than the defined period of time, and wherein the control and evaluation unit is set up to detect the fault condition if a failure of the output voltage and a failure of the at least one output signal occur simultaneously, irrespective of the duration of the failure of the at least one output signal.

* * * * *